(12) United States Patent
Voutsas et al.

(10) Patent No.: US 6,789,499 B2
(45) Date of Patent: Sep. 14, 2004

(54) APPARATUS TO SPUTTER SILICON FILMS

(75) Inventors: Apostolos Voutsas, Portland, OR (US); Yukihiko Nakata, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/213,816

(22) Filed: Aug. 6, 2002

(65) Prior Publication Data

US 2003/0000475 A1 Jan. 2, 2003

Related U.S. Application Data

(62) Division of application No. 09/576,940, filed on May 22, 2000, now Pat. No. 6,429,097.

(51) Int. Cl.[7] ............................................. C23C 16/00
(52) U.S. Cl. .............................. 118/723 E; 118/723 R; 118/719
(58) Field of Search .................... 118/723 E, 723 R, 118/723 MA, 719, 715

(56) References Cited

U.S. PATENT DOCUMENTS

| 4,795,299 A | * | 1/1989 | Boys et al. ................ 414/217 |
| 4,872,938 A | * | 10/1989 | Davis et al. ................ 156/345 |
| 6,090,247 A | * | 7/2000 | White et al. ........... 204/298.26 |
| 2002/0197793 A1 | * | 12/2002 | Dornfest et al. ............ 438/253 |

* cited by examiner

Primary Examiner—Caridad Everhart
(74) Attorney, Agent, or Firm—David C. Ripma; Matthew D. Rabdau

(57) ABSTRACT

A method of physical vapor deposition includes selecting a target material; mixing at least two gases to form a sputtering gas mixture, wherein a first sputtering gas is helium and a second sputtering gas is taken from the gases consisting of neon, argon krypton, xenon and radon; forming a plasma in the sputtering gas mixture atmosphere to sputter atoms from the target material to the substrate thereby forming a layer of target material on the substrate; and annealing the substrate and the deposited layer thereon. An improved physical vapor deposition vacuum chamber includes a target held in a target holder, a substrate held in a substrate holder, a plasma arc generator, and heating rods. A sputtering gas feed system is provided for introducing a mixture of sputtering gases into the chamber; as is a vacuum mechanism comprising at least one turbomolecular pump for evacuating the chamber to a pressure of less than 16 mTorr during deposition. The method and apparatus are particularly suited for forming thin film transistors and liquid crystal displays having thin film transistors therein.

4 Claims, 4 Drawing Sheets

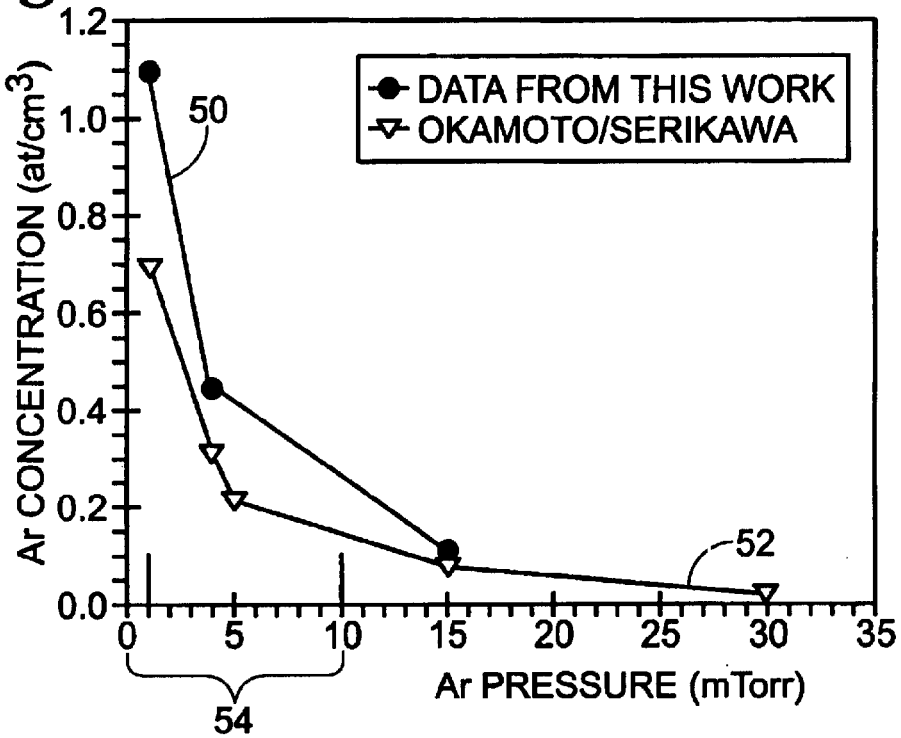
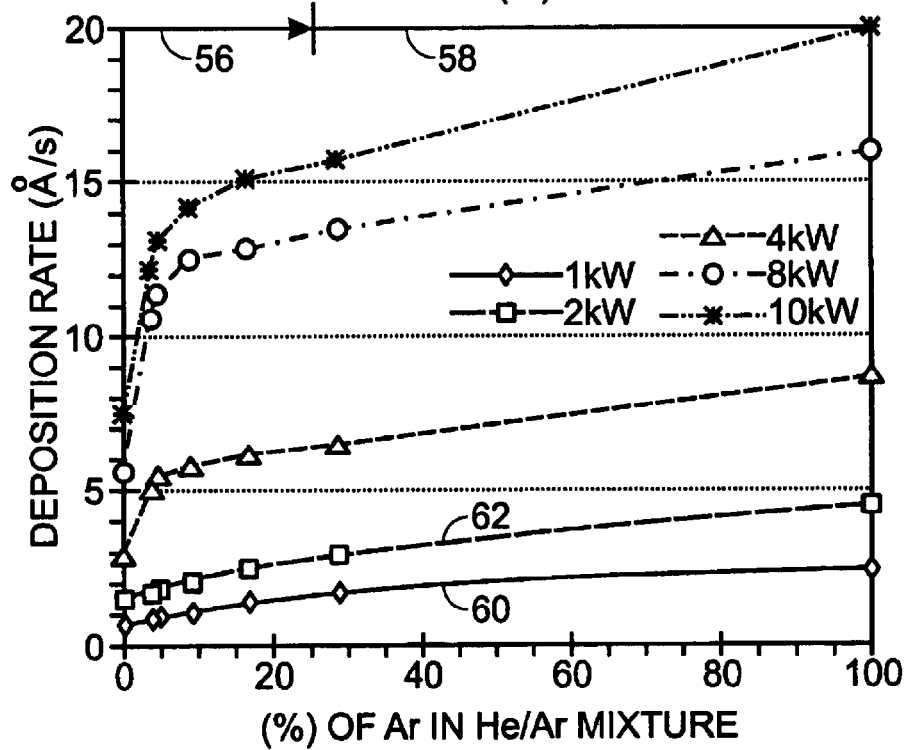

APPARATUS TO SPUTTER SILICON FILMS

CROSS REFERENCE TO RELATED ADDLICATIONS

This application is a divisional of application Ser. No. 09/576,940, filed May 22, 2000, entitled "Apparatus and Method to Sputter Silicon Films," invented by Apostolos Vouteas et al., now U.S. Pat. No. 6,429,097.

FIELD OF THE INVENTION

This invention relates to an apparatus and method for the deposition of thin-film materials used in the fabrication of thin film integrated circuit devices, and thin film devices made according to the method and with the apparatus.

BACKGROUND OF THE INVENTION

In the fabrication of thin film (TF) IC devices, such as thin film transistors (TFTs), a method and apparatus is needed to form the various layers constituting the device. Silicon material, typically amorphous silicon (a-Si) or polysilicon, are used for the active layers of the device and silicon-based insulating layers, typically silicon nitride, $SiN_x$, or silicon oxide, $SiO_x$, are typically used as insulators between the active layers. There are several methods to deposit these films. Some methods rely on chemical reactions between one or more suitable gas-phase species to deposit the silicon-based film on the substrate where TF devices are to be fabricated. These reactions require energy, which may be supplied in the form of thermal energy, such as chemical vapor deposition (CVD), plasma energy, such as plasma-enhanced CVD (PE-CVD), photon energy, such as photo-enhanced, or laser-pyrolysis CVD, or the presence of a catalyst, as in the case of hot-wire CVD.

Another category of deposition methods are the so-called physical vapor deposition (PVD) methods. In one case, the desired material is deposited by bombarding a suitable "target" of this material with atoms of sufficient energy, of a typically neutral or inert gas element. This process is called sputtering and is typically accomplished by farming gas plasma in a gap between a target material and the substrate where the material is to be deposited. Argon is the most common gas used in the sputtering industry. Sputtering is a well-suited method for the formation of the various silicon-based, TF device layers because: (1) it is a safe and environmentally benign technique; (2) it may be used at room temperature and is therefore compatible with any type of substrate; (3) silicon films with very low $H_2$ content may be typically deposited and there is no need for dehydrogenation to release excessive hydrogen, or, hydrogen may be incorporated into the film if, and when, necessary; (4) it is a simpler and more easily scaled method than competitive methods, which rely on chemistry; and (5) it has been successfully used for metal depositions in TF devices, such as TFT-LCDs.

There are, however, some problems associated with silicon sputtering. When Ar, at concentrations of>1 at % (atomic percent), is used as the sputtering gas, capture of Ar by the sputtered film causes structural defects, which lessens the quality of the deposited film. This phenomena reduces the performance of an amorphous silicon (a-Si) TFT device, and also causes difficulties in the crystallization of a-Si, a necessary step in polysilicon TFT technology.

Intrinsic silicon is a resistive material, which, when combined with sputtering in DC mode, leads to the requirement of a significant voltage drop to maintain a given DC power set point. This problem complicates the design of a power supply, increasing the probability of arcing and increasing the extent of plasma damage on the deposited film due to bombardment by highly energized neutral or charged species.

If He is used as the sputtering gas, to eliminate Ar capture and related issues, the deposition rate of the Si or silicon alloy film is significantly reduced, making it unsuitable for mass production.

Silicon deposition by sputtering has not yet reached manufacturing level. As a result, there is no globally accepted solution to these issues. The main concerns are achievement of a reasonable deposition rate, i.e., >10 Å/s (angstroms/sec), low Ar content and good plasma characteristics to reduce plasma damage to the deposited films.

U.S. Pat. No. 5,248,630 to Serikawa et al., granted Sep. 28, 1993, for Thin film silicon semiconductor device and process for producing thereof, describes construction of a thin film device including deposition of a thin film polycrystalline film.

U.S. Pat. No. 5,665,210 to Yamazaki, granted Sep. 9, 1997, for Method of forming insulating films, capacitances and semiconductor devices, describes deposition of metal oxides and nitride films by RF magnetron sputtering with an atmosphere of less than or equal to 25 at % of inert gas.

U.S. Pat. No. 5,817,550 to Carey et al., granted Oct. 6, 1998, for Method for formation of Thin Film Transistors on plastic substrates, describes TFT construction on polymer materials.

T. Serikawa, Enhanced step coverage of $SiO_2$ films sputtered in hydrogen-argon mixed gas, compares thin films deposited in a 30% H-70% Ar atmosphere with those in pure Ar. Japanese Journal of Applied Physics, Vol. 19, No. 5, May 1980, ppL259–L260.

T. Serikawa et al., Properties of magnetron-sputtered silicon nitride films, describes deposition of thin films of 100 nm to 200 nm thickness at 200° C. from a silicon target in a N—Ar mixture. J. Electrochem. Soc., December 1984, pp2928–2933.

A. Okamoto et al., Magnetron-sputtered silicon films for gate electrodes in MOS devices, describes properties of deposited materials under various Ar concentrations. J. Electrochem. Soc., June 1987, pp1479–1484. See FIG. 3.

S. Suyama et al., Electrical characteristics of MOSFETs utilizing oxygen-argon sputter-deposited gate oxide films, describes deposition techniques at low temperature (200° C.) to form triode MOSFETs. IEEE Transactions on Electronic Devices, Vol. ED-34, No. 10, October 1987, pp2124–2128.

T. Serikawa et al., Low-temperature fabrication of high-mobility poly-Si TFTs for large-area LCDs, describes formation of TFTs using laser irradiation. IEEE Transactions on Electronic Devices, Vol. 36, No. 9, September 1989, pp1929–1933.

C. S. McCormick et al., Low temperature fabrication of amorphous silicon thin film transistors by DC reactive magnetron sputtering, J. Vac. Sci Technol. September/October 1997, pp2770–2775.

D. P. Gosain et al., Poly-Si TFT fabrication and hydrogenation using a process compatible with plastic substrates, describes TFT formation on polymer substrates. Electrochem Soc. Proc. vol. 98–22, 1998, pp174–185.

G. K. Giust et al., Low-temperature polysilicon thin-film transistors fabricated from laser-processed sputtered-silicon films, describes an aluminum top-gate coplanar TFT using excimer lasers. IEEE Electronic Device Letters, Vol. 19, No. 9, September 1998, pp343–344.

R. T. Fulks et al., Laser crystallized polysilicon TFTs using LPCVD, PECVD and PVD silicon channel materials—a comparative study, compares the results of TFT construction by various techniques. Material Research Society, April 1999.

SUMMARY OF THE INVENTION

A method of physical vapor deposition includes selecting a target material; mixing at least two gases to form a sputtering gas mixture, wherein a first sputtering gas is helium and a second sputtering gas is taken from the gases consisting of neon, argon krypton, xenon and radon; forming a plasma in the sputtering gas mixture atmosphere to sputter atoms from the target material to the substrate thereby forming a layer of target material on the substrate; and annealing the substrate and the deposited layer thereon.

An improved physical vapor deposition vacuum chamber includes a target held in a target holder, a substrate held in a substrate holder, a plasma arc generator, and heating rods. A sputtering gas feed system is provided for introducing a mixture of sputtering gases into the chamber; as is a vacuum mechanism comprising at least one turbomolecular pump for evacuating the chamber to a pressure of less than 16 mTorr during deposition. The method and apparatus are particularly suited for forming thin film transistors and liquid crystal displays having thin film transistors therein.

An object of the invention is to provide an apparatus and method of forming thin film devices in an Ar-containing atmosphere while controlling capture of Ar atoms in the thin film.

Another object of the invention is to achieve a reasonable deposition rate, i.e., >10 Å/s (angstroms/sec).

A further object of the invention is to produce a thin film device having a low Ar content.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 3 depicts Ar capture as a function of Ar concentration vs. Ar pressure, and compares data from the method of the invention to that gathered by Okamota et al., supra.

FIG. 4 depicts Si deposition rates as a function of % Ar in the process gas and power level.

DETAILED DESCRIPTION OF THE PREFERRED EMBODIMENTS

Figure 1:
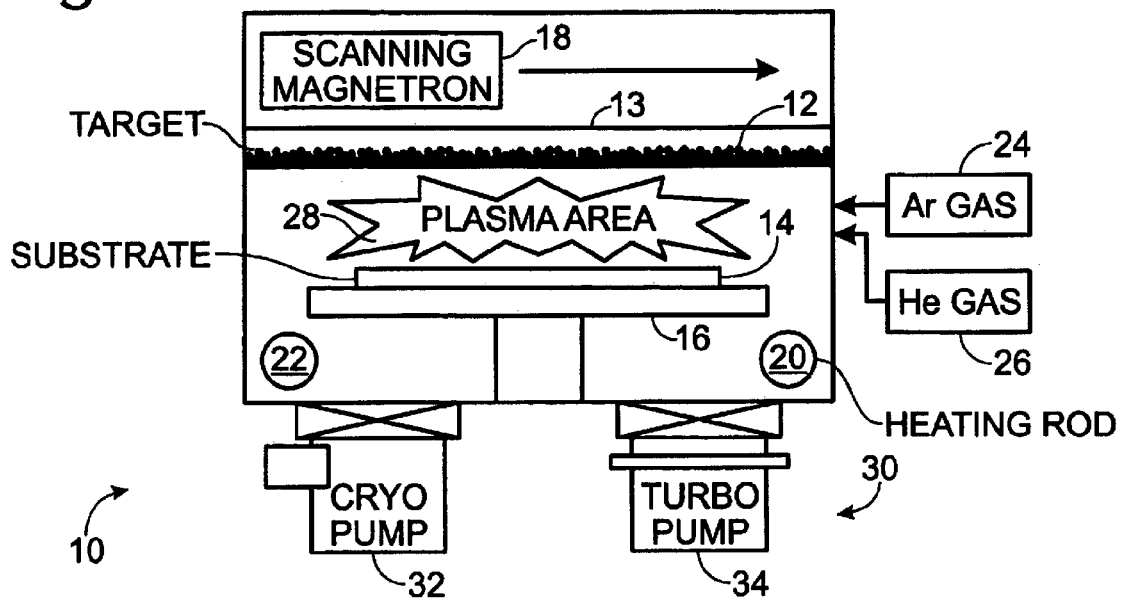
FIG. 1 depicts a PVD chamber constructed according to the invention.

The following describes a method of sputtering, or physical vapor deposition (PVD), for deposition of active layers, such as amorphous silicon (a-Si) and polysilicon, and deposition of insulating layers, such as $SiO_x$ & $SiN_x$, and an apparatus for practicing the method of the invention. These thin-films are used in the fabrication of thin film devices, such as thin film transistors (TFTs), which are most frequently used in liquid crystal displays (LCDs), and the invention will be described using TFT construction as an example. One of ordinary skill in the art will appreciate that the method and apparatus of the invention may be used to fabricate other types of TF semiconductor devices.

The problems associated with thin film deposition have been discussed previously herein. A solution to those problems involves the introduction of an appropriate sputtering gas blend to significantly reduce or eliminate the undesirable effects of Ar, while simultaneously maintaining its merits, particularly the deposition rate. As was mentioned above, use of pure He is not a viable solution to the problems as the deposition rate of He is approximately 3–4 times slower than that of Ar, at a given DC power level.

The addition of a small amount of gas to He gas results in a mixyure that behave more like an Ar gas with respect to deposition rate and more like He gas with respect to plasma characteristics, such as voltage. The optimal window appears to be 3% to 10% Ar in He gas, although mixtures in the range of 1% to 15% Ar in the He/Ar mixture appear to be functional. Under these conditions, the concentration of Ar in the silicon film drops below the detection limit of standard Ar measuring methods, such as secondary ion mass spectrometry (SIMS). Furthermore, the deposition rate of the silicon film remains at 68% to 77% that of films sputtered by pure Ar. This unexpected behavior is clearly not evident by simple extrapolation of prior art results.

The addition of an optional, low-temperature annealing step, after the film deposition, is provided to remove excess He that may have been incorporated in the film during sputtering. He is much easier to remove than Ar by annealing at temperatures in the range of 100° C. to 300° C., by furnace annealing or rapid thermal annealing (RTA), compared to the process for Ar removal, which requires annealing at temperatures in excess of 500° C. This optional low temperature anneal may be applied in both pure silicon and silicon alloy layers, in a-Si and polysilicon TFT applications.

He may easily be removed during ELA on the sputtered thin film. If the He-sputtered silicon film is to be laser annealed, the low-temperature annealing step may not be necessary, as laser annealing is thought to be suitable for the simultaneous removal of He and crystallization of the He-free, a-Si film to polysilicon. The optional low temperature annealing step is more appropriate for solid-phase crystallization of the sputtered silicon film by, for example, rapid thermal annealing (RTA).

The apparatus of the invention is particularly suited to accomplishing the thin film deposition according to the method of the invention. The apparatus includes a vacuum chamber that is pumped by both a cryogenic pump and a turbomolecular pump. FIG. 1 depicts a PVD chamber constructed according to the invention generally at 10. Chamber 10 is sealed to the outside atmosphere and includes a target 12, which is held in place by a target carrier 13, of material to be deposited on a substrate 14, which is held in place on a substrate carrier 16. A magnetic field is generated by a scanning magnetron 18. Heating rods 20, 22 are provided to adjust the temperature of chamber 10. A sputtering gas feed mechanism provides the sputtering gases from gas sources 24, 26, and may be introduced into the chamber independently and mixed in the chamber, or may be introduced through a sputtering gas mixing manifold which mixes the sputtering gases prior to their introduction into the chamber. Plasma 28 is generated in the gap between target 12 and substrate 14. Scanning magnetron 18 is used to intensify and confine the plasma.

An important feature of chamber 10 is its vacuum-producing pumping system, shown generally at 30. In the preferred embodiment, two pumps are attached to chamber 10. In practice, the pumps may be connected to an automated manifold. A cryogenic pump 32 is used to improve the base pressure and reduce the amount of water vapor in the chamber. A turbomolecular pump 34 is used during processing when He gas is flowed, as the cryogenic pump cannot pump He. In an alternate embodiment of the invention, only a turbomolecular pump is used. The provision of two different types of pumps is based on considerations of improved vacuum quality and faster chamber evacuation in mass production. Because the cryogenic pump is not always in use, its lifetime is extended and its regeneration frequency reduced. Chamber 10 is capable of producing pressures during deposition or processing of less than 16 mTorr, and as low as 0.5 mTorr. Chamber 10 may be evacuated to a pressure range of $10^{-8}$ Torr. to $10^{-9}$ Torr. when no gases are flown in the chamber.

Figure 2:
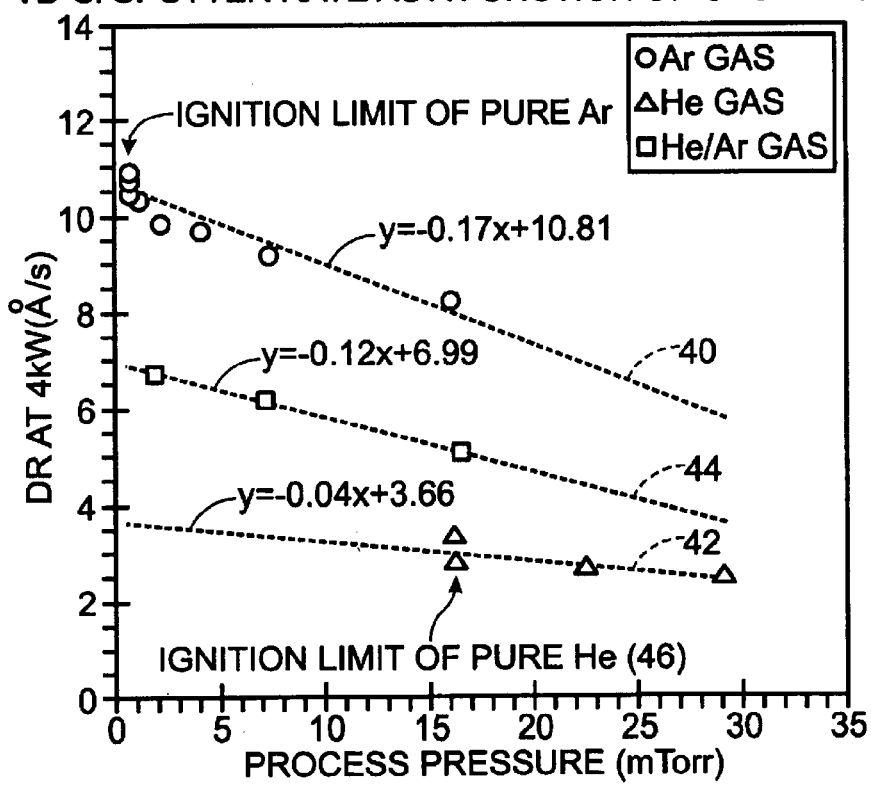
FIG. 2 depicts Si deposition rates as a function of process gas and pressure.

FIG. 2 depicts of the relationship between silicon film deposition rate, process pressure and process gas. In this particular case, all films were deposited at 4 kW and at 400° C. A trace for pure Ar is shown at 40, for pure He at 42 and for an Ar/He mixture at 44. As expected, the deposition rate decreased as the sputtering pressure increased, under constant power. However, the effect of the process pressure seemed to be more significant for sputtering in argon than in He. This may be explained by considering the frequency of gas phase collisions, as a function of pressure and size of sputtering atoms. At the same pressure, a larger molecule has a higher collision probability.

As the pressure increases, the interaction between smaller mean free path and higher collision cross-section becomes more important for a larger atom, such as Ar, than a small atom, such as He. Hence, the effect of pressure is more significant for Ar sputtering. FIG. 2 indicates that He has a higher ignition limit in reference to the ignition limit of Ar, i.e., He plasma will not ignite at pressures below 16 mTorr, 46. The ignition problem with the He gas may be related to secondary electron ionization phenomena. He is a much smaller atom than Ar; hence, it has a smaller ionization cross-section. In other words, the probability of a collision between an electron and an inert atom, to produce an ionized atom, is reduced in the case of He. This means that, in order to produce a self-sustained glow discharge, a higher density of He atoms is required, which requires a higher operating pressure than that required for Ar. It should be further noted that an interesting intermediate case is obtained when Ar and He are mixed together, as illustrated by line 44 in FIG. 2. Not only the deposition rate of the mixture is higher than that of "pure" He, but the ignition of the mixture tends to follow the characteristics of Ar. The ignition limit of the Ar/He mixture is approximately the same as that of pure Ar.

The appropriate pressure range for Si sputtering is determined by the ignition characteristics of the sputtering gas and the deposited film properties. Data from the apparatus and method of the invention is shown by line 50 in FIG. 3, while that from Okamoto et al., supra, is shown by line 52. FIG. 3 shows that, as the pressure increases, the degree of incorporation of the sputtering gas, Ar in this example, decreases; i.e., a smaller percentage of the sputtering gas is captured in the substrate. This is a desirable property.

However, the structural characteristics of the sputtered film also change at higher pressures. The film becomes more porous, and tends to absorb more impurities when it is exposed to the ambient atmosphere. Thus, the electrical performance of the film tends to deteriorate at higher pressures. In addition, the deposition rate of the film decreases. These are not desirable properties.

A reasonable compromise between the opposing trends exists in the pressure range of 1–15 mTorr for mixtures of He/Ar. Because of the presence of Ar in the mixture, plasma may be ignited at low pressures. Even though reduction of both Ar and He content is achieved at the high-pressure end, the range of 1.0 mTorr. to 10 mTorr may be effective, and the range of 2.5 mTorr. to 10 mTorr. may be preferable from the point of view of film quality and good plasma behavior, as shown in FIG. 3 at 54.

FIG. 4 depicts the deposition rate of silicon at various DC power levels, as a function of the percentage of Ar in the He/Ar sputtering gas. A number of conclusions may be made from these data. The dependency of the deposition rate on the percentage of Ar appears to follow two patterns. In the range of 0% Ar to 25% Ar 56, the deposition rate is strongly affected by the percentage of Ar in the sputtering gas mixture; in the range of 25%+Ar 58, the deposition rate follows a linear relationship with respect to the % Ar.

The power level also has a profound effect on this dependency. At low power levels, i.e., 1 kW, line 60, the initial range is much smoother and, overall, the deposition rate between pure He and pure Ar sputtering is not very different. Power levels are shown for 2 kW, 62; 4 kW, 64; 8 kW, 66, and 10 kW, 68. Above 2 kW however, the transition from pure He to pure Ar is quite distinct and is associated with a significant increase in the deposition rate. These data indicate that, as far as DC power, the regime of interest is above 2 kW for optimum deposition rates.

As far as Ar capture, the significant parameters are: (a) percentage of Ar in the gas feed, and (b) sputter pressure. In addition to the Ar content, these parameters also affect the sputter rate, the plasma voltage and the film quality, as pressure affects the film structure. The deposition of silicon with He/Ar mixture was measured at various operating pressures. Two pressure regimes appear to exist: 5–6 mTorr and 16–17 mTorr. Those of ordinary skill in the art will understand that without any Ar in the mixture, He cannot ignite below 16 mTorr., as shown at 46 in FIG. 2. Hence, the only way to deposit silicon with He at a lower pressure is to add a small amount of Ar gas. A small amount of Ar gas in the film is also thought to provide a more rigid silicon network and improve the mechanical properties of the film. According to the literature, Ar, even at concentrations as low as 0.2 at % causes significant retardation to the crystalline growth of silicon. The notation "gas % at" indicates percentage of a gas in a film, while the notation "gas %" indicates the percentage of a particular gas in a mixture of gases. It has been speculated that this phenomenon is due to the formation of Ar bubbles in the film. Such formation will affect the physical and electrical properties of the film either in the a-Si phase or in the polycrystalline phase. In the case of alloy deposition, it will affect the silicon bonding network and, hence, the physical and electrical properties of insulating films, such as $SiO_x$ or $SiN_x$. Based on these considerations, an appropriate Ar content range, for cases where Ar content source is to be minimized is: $2 \cdot 10^{18}$ at/cm$^3$<Ar <$2.5 \cdot 10^{19}$ at/cm$^3$, or, 40 ppm<Ar<0.05%.

There are some cases where the retardation of the nucleation and crystalline growth in the silicon film are considered positive effects. One example involves the introduction of a catalyst material, such as nickel, at specified locations into the silicon film, to promote nuclei formation and crystalline growth from these preferred locations. This is achieved by subjecting the silicon film to a thermal annealing cycle, thereby enabling the phase transformation from a-Si to polysilicon at low temperatures via the use of the catalyst. To improve the crystalline quality and its uniformity, it is important to suppress nucleation and crystalline growth in silicon material void of the catalyst. The way to achieve this is to utilize silicon material that is particularly difficult to crystallize without an added catalyst. Such material may be sputtered silicon with a specified Ar content which is high enough to suppress partial solid-phase crystallization of silicon material void of catalyst. Hence, from this point of view we define the appropriate Ar content in the range of: $2 \cdot 10^{18}$ at/cm$^3$<Ar<$2 \cdot 10^{20}$ at/cm$^3$.

TABLE 1

Ar concentration in sputtered silicon films

| Power (kW) | Pressure (mTorr) | Sputtering Gas | Ar content (at/cm$^3$) |
|---|---|---|---|
| 8 | 14–16 | Pure He | <$2 \cdot 10^{18}$ |
|  |  | He/(3.8%) Ar | $2–5 \cdot 10^{18}$ |
|  |  | He/(10%) Ar | $4–7 \cdot 10^{18}$ |
|  |  | Pure Ar | $6 \cdot 10^{19}$ |
| 8 | 5–6 | Pure Ar | $2 \cdot 10^{20}$ |

Table 1 shows examples of the Ar content in silicon films sputtered at different pressure and sputtering gas conditions. The Ar content may be controlled in the ranges identified above, by the deposition pressure and/or the type of sputtering gas. The Ar content in the case of pure Ar sputtering is $6 \cdot 10^{19}$ at/cm$^3$ and is reduced by more than an order of magnitude in the case of pure He sputtering, $2 \cdot 10^{18}$ at/cm$^3$, which is the detection limit of SIMS analysis. When the He/(3.8%)Ar gas mixture is used, the Ar content in the film is only marginally increased, $2–5 \cdot 10^{18}$ at/cm$^3$. Moreover, this increase may be attributed to noise in the measurement, as the Ar concentration is very close to the detection limit of the measuring technique. Another slight increase in film Ar content occurs with 10% Ar. Incorporation of Ar, then, is not an issue when He/Ar is used as the sputtering gas.

Figure 5:
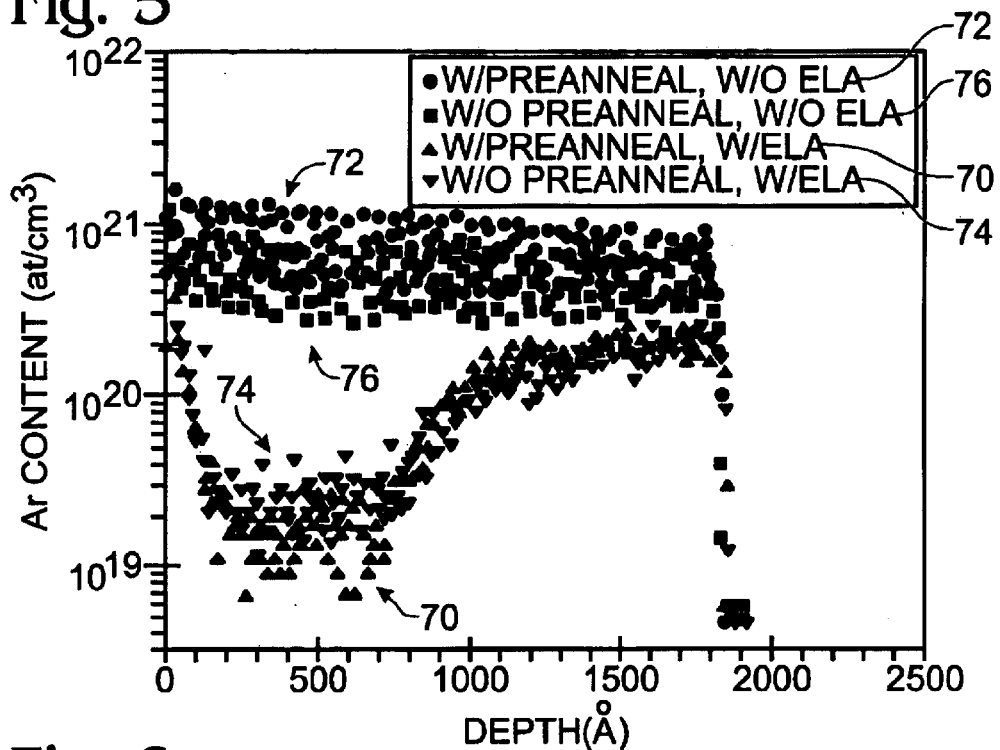
FIG. 5 depicts Ar capture and depth profile before and after annealing of the sputtered thin film by excimer laser anneal (ELA).

As previously described, excimer laser anneal (ELA) may be used to convert an a-Si layer to a polysilicon layer. FIG. 5 shows the Ar content in sputtered silicon films before and after exposure to excimer laser anneal (ELA) process. Regions of data points are shown for Ar content with pre-anneal and with ELA, 70, and without ELA, 72; without pre-anneal and with ELA, 74, and without ELA, 76. The exposure to ELA, regions 70, 74, results in a reduction in the Ar content in the post-ELA films of more than an order of magnitude, with respect to pre-ELA films. In contrast to ELA, subjecting the films to a thermal anneal at 450° C. for three hours in nitrogen ambient produces no effect at all in the Ar content. Hence, polysilicon films, produced by ELA of PVD amorphous silicon films, tend to contain Ar at a concentration of about $1–2 \cdot 10^{19}$ at/cm$^3$ or less. Thus, the ELA process is another way to affect the concentration of Ar in PVD-Si films. This is an important feature of the process, because, when the Ar content is required to be initially high to suppress partial crystallization, it may subsequently be reduced by applying ELA process, so that the quality of the film is improved by effectively decreasing its Ar content.

Figure 6:
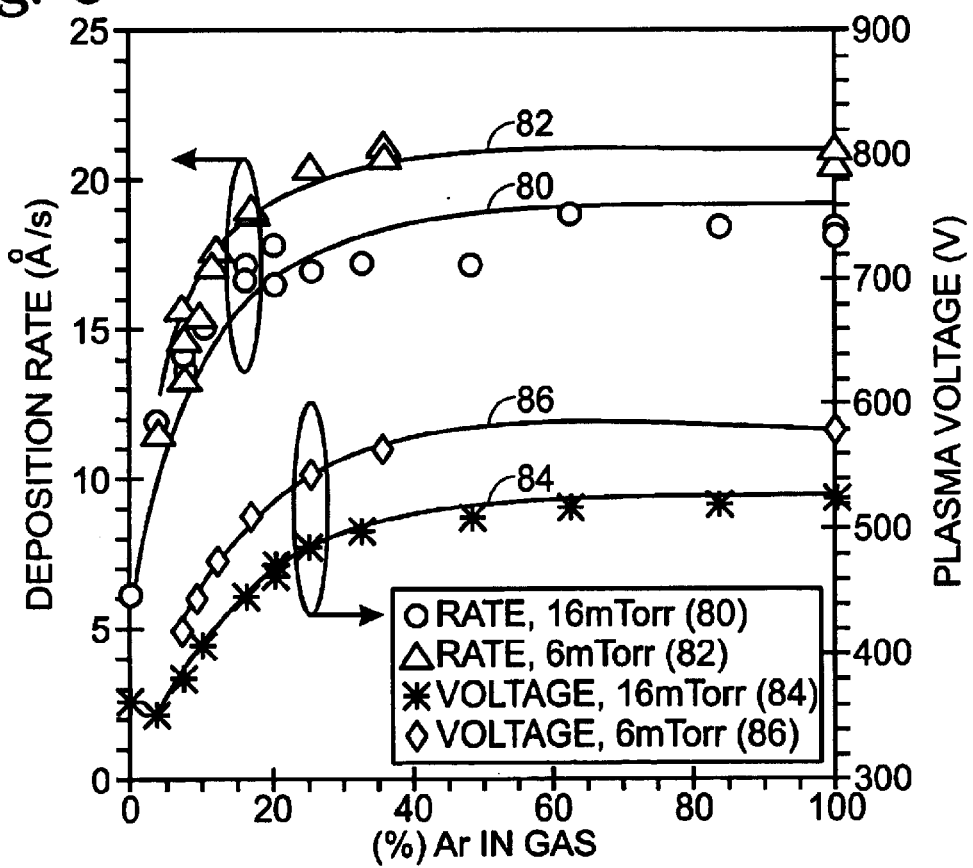
FIG. 6 depicts Si deposition rate and plasma voltage as a function of (1) %-age of Ar in the sputtering gas and (2) sputtering pressure.

FIG. 6 shows the deposition rate, lines 80, 82, and measured plasma voltage, lines 84, 86, as functions of the % Ar in the mixture and the sputtering pressure. Notice that in a similar fashion to the deposition rate, the plasma voltage is also strongly affected by the consistency of the sputtering gas. The addition of a small amount of Ar in the He gas increases the plasma voltage, but it clearly remains significantly lower to that corresponding to the case of pure-Ar sputtering. Even with the modest addition of 3.8% Ar in the He gas, the deposition rate is shown to double. Hence, the He/Ar mixture indeed provides an excellent approach to improve film quality, as determined by a decrease the in-film Ar content and reduced plasma voltage requirement, without sacrificing the deposition rate. The 3–10% Ar content regime seems to be the most promising.

Figure 7:
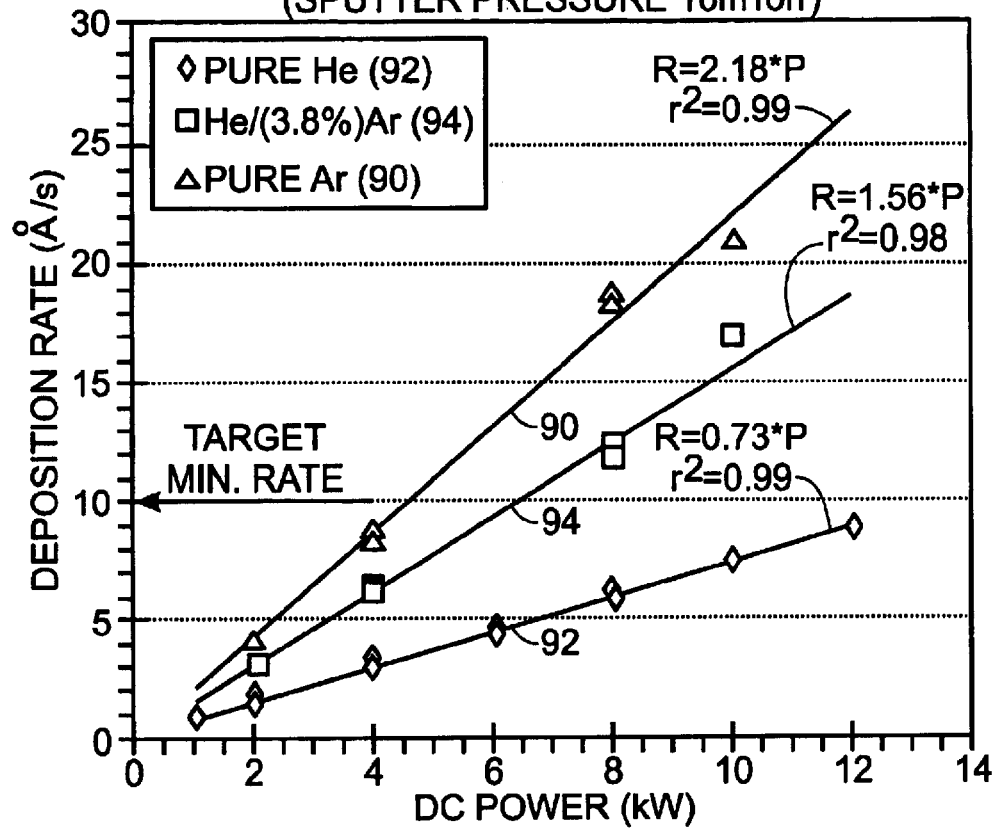
FIG. 7 depicts Si deposition rate as a function of DC power and sputtering gas composition.

FIG. 7 shows an example of the effect of DC power on the deposition rate of various sputtered silicon films. This comparison illustrates the power requirements between silicon films sputtered by pure Ar, 90, and those sputtered by pure He, 92, or by He/Ar mixture, 94, to achieve a certain level of deposition rate, or throughput. The slope of each line indicates the deposition rate in each sputtering gas in Å/s-kW. Notice that sputtering by pure Ar results in threefold higher deposition rate than sputtering by pure-He: 2.18 Å/s-kW versus 0.73 Å/s-kW.

Notice also that when a modest amount of Ar in added in the He gas, i.e., 3.8% Ar in He, the effect on the deposition rate is quite pronounced. For this modest addition of Ar, a more than twofold increase in the rate is obtained: 1.56 Å/s-kW versus 0.73 Å/s-kW. Hence, the He/(3.8%)Ar gas behaves more like Ar gas when it comes to deposition rate and more like He gas when it comes to plasma voltage, as shown in FIG. 6. Moreover, the deposition rate target of 10 Å/s is easily attainable with the He/Ar mixture at relatively low DC power levels, 6–7 kW, whereas it requires a DC power level of 13–14 kW for pure He. This non-linear behavior of the He/Ar mixtures is an important property, which has not been identified or suggested in previous works.

To deposit a-Si film, hydrogen gas may be also flown, in addition to He & Ar. To sputter $SiO_x$, oxygen and/or hydrogen gas may be flown, while for $SiN_x$, nitrogen and/or hydrogen may be flown, simultaneously with the He/Ar gas. The reduced plasma voltage, afforded by the He sputtering gas, is expected to be very beneficial for the case of dielectric film deposition, such as $SiO_2$ or $SiN_x$. In this case, plasma damage is typically responsible for the introduction of fixed charges in the insulating films. All of the inert gases, Ne, Ar, Kr, Xe and Rn, may be used in chamber 10, although, as previously mentioned, Ar is by far the most common gas used in PVD. Lower plasma voltage may reduce the plasma damage and, hence, increase the quality of the dielectric layer.

Figure 8:
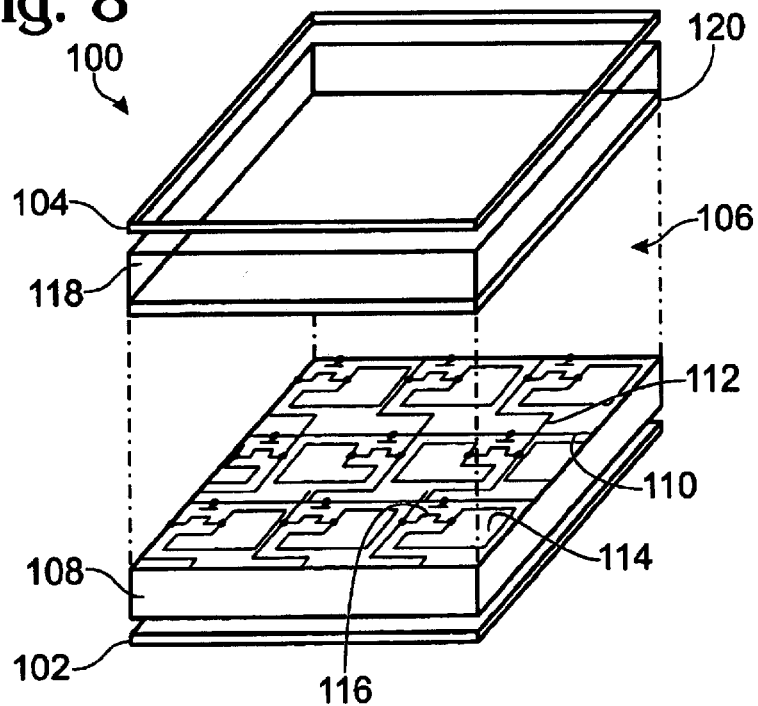
FIG. 8 depicts a thin film device constructed according to the invention.

Referring now to FIG. 8, a liquid crystal display (LCD) apparatus 100 includes a lower polarizing plate 102 and an upper polarizing plate 104, which sandwich a liquid crystal (LC) layer 106 therebetween. LC layer 106 includes an insulating substrate 108 made of glass or other suitable material. Plural gate lines 110 run parallel with each other, and plural source lines 112 cross their respective gate lines 110. Lines 110 and 112 are formed on insulating substrate 108. Pixel electrodes 114 are disposed at positions adjacent to respective crossings of gate lines 110 and source lines 112, thus forming a matrix on insulating substrate 108. Pixel electrodes 114 are connected to gate lines 110 and source lines 112 through TFTs 116 of this example as switching elements.

LCD apparatus 100 further includes an insulating substrate 118 made of glass or other suitable material, which is disposed so as to oppose insulating substrate 108. A counter electrode 120 is formed on the inner surface of insulating substrate 118. Insulating substrates 108 and 118 are attached together, with liquid crystal contained therebetween, thus forming a liquid crystal layer 106 interposed pixel electrodes 114 and counter electrode 120. Polarizing plates 102 and 104 adhere to the outer surfaces of insulating substrates 108 and 118. The silicon or polysilicon layers of LCD 100 and TFTs 116 may be deposited by the PVD method of the invention, and will have the characteristics described in connection therewith.

Thus, a method for deposition of a-Si, polysilicon, $SiO_x$, $SiN_x$, and doped silicon alloys by a sputtering process using a gas mixture, including a He/Ar gas mixture, has been disclosed. The invention also includes an apparatus necessary to perform the method of the invention, including a vacuum chamber pumped by combination of turbomolecular pump and cryogenic pump. Thin film devices manufactured according to the invention have also been described. It will be appreciated that further variations and modifications thereof may be made within the scope of the invention as defined in the appended claims.

We claim:

1. An improved physical vapor deposition vacuum chamber, a target held in a target holder, a substrate held in a substrate holder, a plasma arc generator, and heating rods, the improvement comprising:

a sputtering gas feed system for introducing a mixture of sputtering gases into the chamber, the sputtering gases including helium;

a vacuum mechanism including a cryogenic pump for evacuating the chamber to a base pressure before sputtering gases are introduced into the chamber; and the vacuum mechanism further including at least one turbomolecular pump for evacuating the chamber to a pressure of less than 16 mTorr during deposition.

2. The improved physical vapor deposition vacuum chamber of claim 1 wherein the base pressure said vacuum mechanism achieves by means of said cryogenic pump before sputtering gases are introduced into the chamber is in the range of $10^{-8}$ Tort to $10^{-9}$ Torr.

3. The improved physical vapor deposition vacuum chamber of claim 1 wherein said feed mechanism includes separate feed lines for each sputtering gas.

4. The improved physical vapor deposition vacuum chamber of claim 1 wherein said feed mechanism includes a sputtering gas manifold for mixing said sputtering gases prior to introduction of the sputtering gas mixture into the chamber.

* * * * *